(12) United States Patent
Hammerschmidt

(10) Patent No.: US 10,520,337 B2
(45) Date of Patent: Dec. 31, 2019

(54) SENSOR CONTROLLER, SENSOR SIGNAL RECEIVER, INCREMENTAL MAGNETIC SPEED SENSOR MODULE, METHOD FOR A SENSOR CONTROLLER, METHOD FOR A SENSOR SIGNAL RECEIVER AND COMPUTER PROGRAM

(71) Applicant: Infineon Technologies AG, Neubiberg (DE)

(72) Inventor: Dirk Hammerschmidt, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 16 days.

(21) Appl. No.: 15/875,223

(22) Filed: Jan. 19, 2018

(65) Prior Publication Data

US 2018/0209820 A1 Jul. 26, 2018

(30) Foreign Application Priority Data

Jan. 26, 2017 (DE) .......................... 10 2017 101 545

(51) Int. Cl.
| | |
|---|---|
| *G01D 3/08* | (2006.01) |
| *G01D 5/14* | (2006.01) |
| *G01D 21/00* | (2006.01) |
| *G01D 21/02* | (2006.01) |
| *G01P 21/02* | (2006.01) |
| *G01P 3/481* | (2006.01) |
| *G01P 3/489* | (2006.01) |
| *G01R 33/00* | (2006.01) |

(Continued)

(52) U.S. Cl.
CPC ............. *G01D 5/2454* (2013.01); *G01D 3/08* (2013.01); *G01D 5/145* (2013.01); *G01D 21/00* (2013.01); *G01D 21/02* (2013.01); *G01P 3/481* (2013.01); *G01P 3/489* (2013.01); *G01P 21/02* (2013.01); *G01R 33/0035* (2013.01); *G01R 33/0041* (2013.01); *G01R 33/09* (2013.01)

(58) Field of Classification Search
CPC .......... G01D 5/245; G01D 5/14; G01D 21/02; G01R 33/09; G01R 33/00
USPC ........... 340/4.42, 3.43, 3.44, 3.31; 701/1, 33
See application file for complete search history.

(56) References Cited

U.S. PATENT DOCUMENTS 5,229,975 A * 7/1993 Truesdell .................. G01S 7/64
                                                            367/107
5,512,890 A * 4/1996 Everson, Jr. ............. G01D 3/08
                                                            340/3.43

(Continued)

*Primary Examiner* — Nam V Nguyen
(74) *Attorney, Agent, or Firm* — Harrity & Harrity, LLP

(57) ABSTRACT

A sensor controller for a sensor module includes at least one interface to obtain sensor information from the sensor module and to communicate with a sensor signal receiver. The sensor controller includes a control module to control the at least one interface. The control module is configured to obtain the sensor information from the sensor module; generate a sensor signal based on the sensor information; and transmit the sensor signal. The control module is further configured to detect a fault state of the sensor module; transmit a fault indicator if the fault state indicates a failure of at least a part of the sensor module; and receive a control signal from the sensor signal receiver based on the fault indicator. The control signal includes at least one fault handling instruction. The control module is configured to execute the at least one fault handling instruction.

20 Claims, 4 Drawing Sheets

(51) Int. Cl.
*G01R 33/09* (2006.01)
*G01D 5/245* (2006.01)

(56) References Cited

U.S. PATENT DOCUMENTS

| | | | | |
|---|---|---|---|---|
| 6,259,981 | B1 * | 7/2001 | Wilcosky | B60R 16/0232 340/459 |
| 6,338,010 | B1 * | 1/2002 | Sparks | B60R 16/0315 340/459 |
| 6,711,472 | B2 * | 3/2004 | Mencher | F02D 41/3005 340/3.3 |
| 6,815,944 | B2 * | 11/2004 | Vig | G01D 5/145 324/179 |
| 6,909,944 | B2 * | 6/2005 | Pillar | B60R 16/0315 701/1 |
| 7,302,320 | B2 * | 11/2007 | Nasr | A62C 27/00 701/22 |
| 7,322,250 | B1 * | 1/2008 | Discenzo | G01L 1/241 73/800 |
| 7,522,979 | B2 * | 4/2009 | Pillar | G01M 17/00 340/438 |
| 8,283,937 | B2 * | 10/2012 | Hsieh | G05B 23/027 324/713 |
| 9,238,465 | B1 * | 1/2016 | Ghannam | B60W 50/0205 |
| 9,606,160 | B2 * | 3/2017 | Ochs | G01R 31/006 |
| 9,806,656 | B1 * | 10/2017 | Pramod | H02P 23/14 |
| 9,851,416 | B2 * | 12/2017 | Scheller | G01P 3/44 |
| 2013/0320970 | A1 | 12/2013 | Foletto et al. | |
| 2017/0328946 | A1 * | 11/2017 | Froehner | G01R 31/085 |

\* cited by examiner

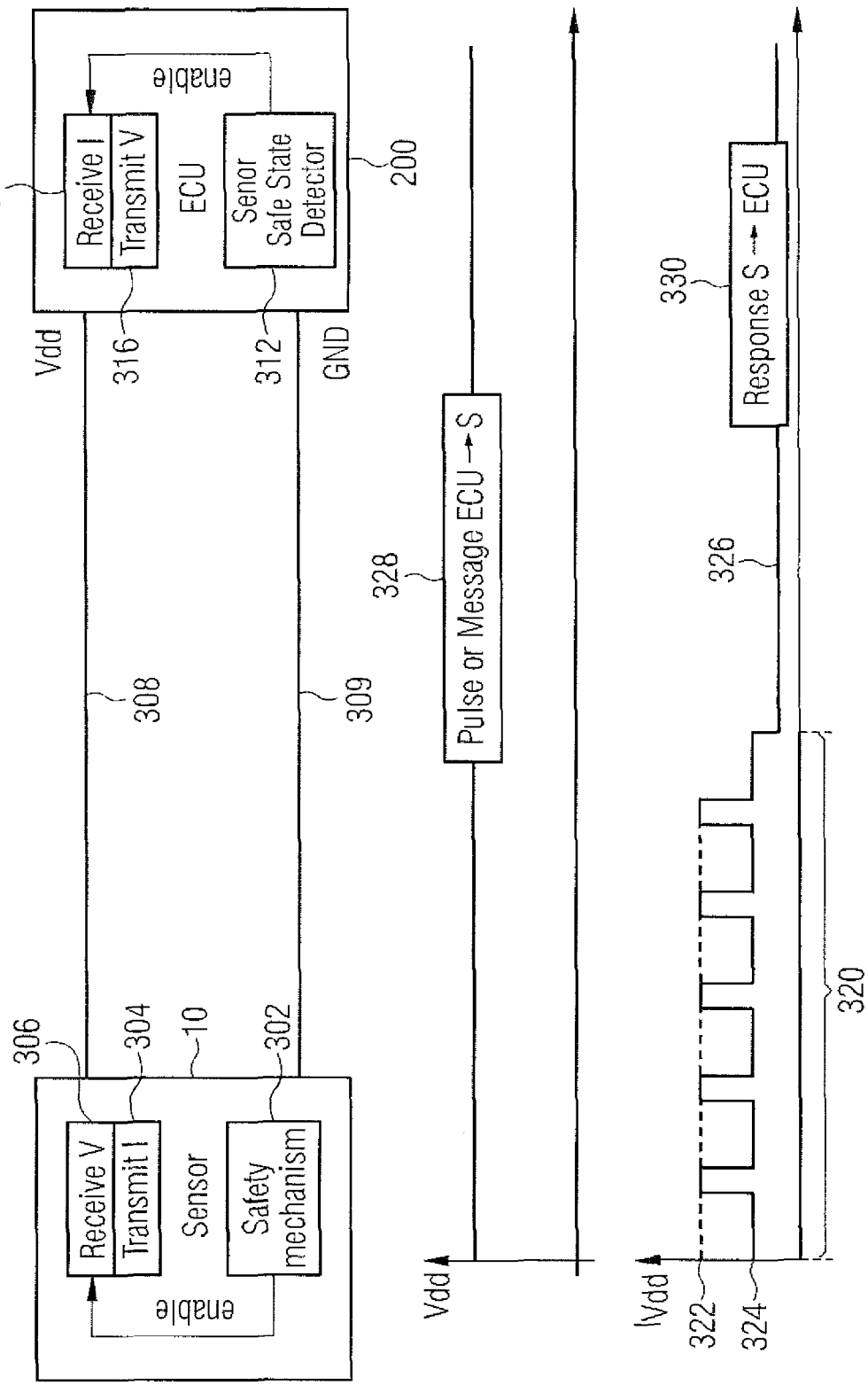

SENSOR CONTROLLER, SENSOR SIGNAL RECEIVER, INCREMENTAL MAGNETIC SPEED SENSOR MODULE, METHOD FOR A SENSOR CONTROLLER, METHOD FOR A SENSOR SIGNAL RECEIVER AND COMPUTER PROGRAM

RELATED APPLICATION

This application claims priority under 35 U.S.C. § 119 to German Patent Application No. 102017101545.0, filed on Jan. 26, 2017, the contents of which are incorporated by reference herein in their entirety.

TECHNICAL FIELD

Examples relate to concepts for sensors, and in particular to a sensor controller, a sensor signal receiver, an incremental magnetic speed sensor module, a method for a sensor controller, a method for a sensor signal receiver and a computer program.

BACKGROUND

In many fields of technology, data are transmitted from one entity to another entity using a digital encoding scheme. While in many applications highly sophisticated transmission schemes are employed, in some fields a tendency exists to allow less complex components of a system to transmit or even exchange data via a robust protocol allowing both a high throughput and a simple implementation or architecture. For example, in motorized systems, a number of low- or medium complexity sensors may use robust protocols to communicate with one or more complex computing units accumulating the sensor data transmitted by said sensors.

SUMMARY

An example relates to a sensor controller for a sensor module. The sensor controller comprises at least one interface to obtain sensor information from the sensor module and to communicate with a sensor signal receiver. The sensor controller further comprises a control module to control the at least one interface. The control module is configured to obtain the sensor information from the sensor module. The control module is further configured to generate a sensor signal based on the sensor information. The control module is further con-figured to transmit the sensor signal. The control module is further configured to detect a fault state of the sensor module. The control module is further configured to transmit a fault indicator if the fault state indicates a failure of at least a part of the sensor module. The control module is further configured to receive a control signal from the sensor signal receiver in response to the fault indicator. The control signal comprises at least one fault handling instruction. The control module is further configured to execute the at least one fault handling instruction.

Another example relates to a sensor signal receiver comprising at least one interface to communicate with a sensor controller. The sensor signal receiver further comprises a control module to control the at least one interface. The control module is further configured to receive a fault indicator from the sensor controller via the at least one interface. The control module is further configured to provide a control signal to the sensor controller via the at least one interface in response to the fault indicator. The control signal comprises at least one fault handling instruction.

Another example relates to an incremental magnetic speed sensor module for automotive use comprising a sensor controller. The sensor controller comprises at least one interface to obtain sensor information from the sensor module and to communicate with a sensor signal receiver. The sensor controller further comprises a control module to control the at least one interface. The control module is further configured to obtain the sensor information from the sensor module. The control module is further configured to generate a sensor signal based on the sensor information. The control module is further configured to transmit the sensor signal. The control module is further configured to detect a fault state of the sensor module. The control module is further configured to transmit a fault indicator if the fault state indicates a failure of at least a part of the sensor module. The control module is further configured to receive a control signal from the sensor signal receiver in response to the fault indicator. The control signal comprises at least one fault handling instruction. The control module is further configured to execute the at least one fault handling instruction.

Another example relates to a method for a sensor controller for a sensor module. The method comprises obtaining sensor information from the sensor module. The method further comprises generating a sensor signal based on the sensor information. The method further comprises transmitting the sensor signal. The method further comprises detecting a fault state of the sensor module. The method further comprises transmitting a fault indicator if the fault state indicates a failure of at least a part of the sensor module. The method further comprises receiving a control signal from the sensor signal receiver in response to the fault indicator. The control signal comprises at least one fault handling instruction. The method further comprises executing the at least one fault handling instruction.

Another example relates to a method for a sensor signal receiver. The method comprises receiving a fault indicator from a sensor controller. The method further comprises providing a control signal to the sensor controller in response to the fault indicator. The control signal comprises at least one fault handling instruction.

Another example relates to a computer program having a program code for performing at least one of the above methods, when the computer program is executed on a computer, a processor, or a programmable hardware component.

BRIEF DESCRIPTION OF THE DRAWINGS

Some examples of apparatuses and/or methods will be described in the following by way of example only, and with reference to the accompanying figures, in which

FIG. 3 shows a system comprising a sensor controller and a sensor signal receiver connected via a two wire connection.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than two elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
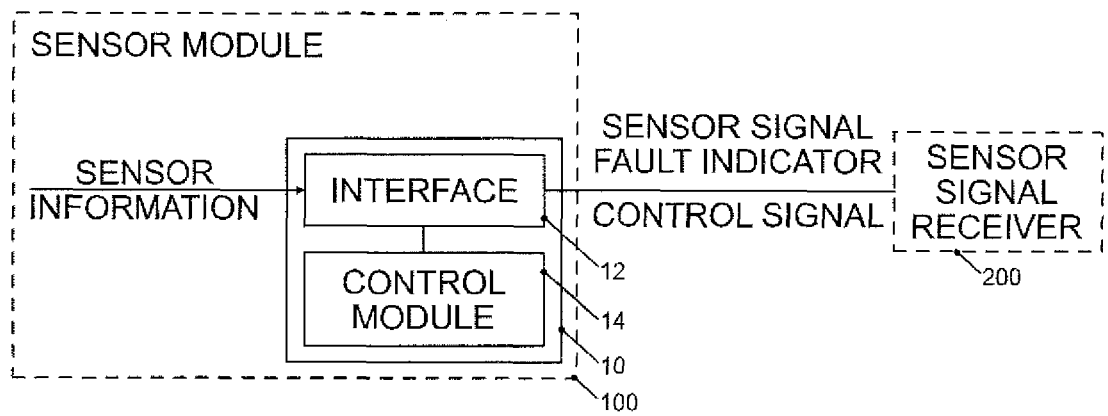
FIG. 1 illustrates a block diagram of a sensor controller for a sensor module.

FIG. 1 illustrates a block diagram of a sensor controller 10 for a sensor module 100. The sensor controller 10 comprises at least one interface 12 to obtain sensor information from the sensor module 100 and to communicate with a sensor signal receiver 200. The sensor controller 10 further comprises a control module 14 to control the at least one interface 12. The control module 14 is further configured to obtain the sensor information from the sensor module 100. The control module 14 is further configured to generate a sensor signal based on the sensor information. The control module 14 is further configured to transmit the sensor signal.

Embodiments further provide the sensor module 100 comprising the sensor controller 10. For example, an incremental magnetic speed sensor module 100 for automotive use (e.g. in ABS, engine control or transmission control) may comprise the sensor controller. For example, the sensor module 100 may correspond to an automotive sensor module. For example, the sensor module 100 may further comprise one or more sensors to generate the sensor information. For example, the sensor module 100 may comprise at least one element of the group of an automotive sensor, an (incremental) magnetic speed sensor (for automotive use), and a wheel speed sensor. For example, the sensor module 100 may be comprised in an Anti Blocking System (ABS), in an engine controller or in a transmission controller. Examples further provide a system comprising the sensor module 100, the sensor controller 10 and the sensor signal receiver 200.

The at least one interface 12 may be configured to obtain one or more analog voltages or currents from the sensor module 100 to obtain the sensor information. Alternatively, the at least one interface may be configured to receive one or more digital values to obtain the sensor information. The sensor information may comprise one or more analog values (e.g. currents, voltages or capacitances) or digital values (e.g. as binary code, temperature code or pulse-width modulated values).

For example, the at least one interface 12 may be configured to communicate with the sensor signal receiver using a wired connection, e.g. a two wire or a three wire connection. Alternatively, the at least one interface 12 may be configured to wirelessly communicate with the sensor signal receiver 200. The wireless communication may enable a placement of the sensor module within a separate part of a vehicle comprising the sensor signal receiver, for example. The control module 14 may be configured to activate a (wireless) receiver portion of the at least one interface 12 if the fault state indicates a failure of at least a part of the sensor module 100, e.g. as long as the sensor module and/or the sensor controller is in a diagnostic mode/safe mode. The control module 14 may be configured to deactivate the (wireless) receiver portion of the at least one interface 12 if the fault state indicates no failure of the sensor controller or the sensor module. This may help reduce an energy consumption of the sensor controller.

The control module 14 may be configured to measure or interpret one or more analog voltages, currents or capacitances from the sensor module 100 to obtain the sensor information. Alternatively, the control module 14 may be configured to receive, read out or interpret one or more digital values to obtain the sensor information.

The control module 14 may be configured to generate a plurality of successive signal edges to generate the sensor signal, for example. For example, a temporal distance or interval between successive signal edges may indicate an information content of the sensor signal. For example, the control module 14 may be configured to modulate a current (e.g. a supply current) or to modulate a voltage (e.g. an open drain voltage) to generate or transmit the sensor signal (and/or diagnostic information). For example, a signal edge within the sensor signal may indicate a pulse of an incremental magnetic speed sensor.

The control module 14 is further configured to detect a fault state of the sensor module 100. For example, the control module 14 may be configured to detect a malfunctioning of the sensor module 100 to detect the fault state. For example, the control module 14 may be configured to detect implausible values of the sensor information to detect the fault state of the sensor module. For example, the control module 14 may be configured to obtain information related to a malfunctioning of the sensor module 100 from the sensor module 100 to detect the fault state of the sensor module. The fault state of the sensor module 100 may indicate a malfunctioning of the sensor module 100, e.g. a failure of at least a part of the sensor module.

The control module 14 is further configured to transmit a fault indicator (via the at least one interface 12) if the fault state indicates a failure of at least a part of the sensor module 100. For example, the fault indicator may correspond to a voltage level, a current level, a length of a signal pulse or to a succession of signal values not used for the sensor signal. For example, the control module 14 may be configured to transmit the fault indicator instead of the sensor signal if the fault state indicates a failure of at least a part of the sensor module 100.

For example, the control module 14 may be configured to transmit the sensor signal based on two or more sensor signal transmission current levels (e.g. based on a current modulation of the supply voltage). The control module 14 may be is configured to transmit the fault indicator by using a current level above or below (both of) the two or more sensor signal transmission current levels. This may enable an improved recognition of the fault indicator by the sensor signal receiver.

Alternatively (or additionally), the control module 14 may be configured to transmit the sensor signal based on one or more signal pulses. Pulses of the one or more pulses may comprise a pre-defined maximal pulse width (e.g. a longest pre-defined pulse width). For example, a protocol may use a number of (e.g. few) different pulse lengths in normal operation for the encoding of direction detection or field strength indication. For example the pulses of the one or more pulses may comprise a pre-defined minimal pulse width and a pre-defined maximal pulse width. The control module 14 may be configured to transmit the fault indicator by transmitting a pulse having a pulse width at least 10% longer (or at least 20% longer, at least 30% longer, at least 50% longer) than the pre-defined maximal pulse width (of the one or more pulses). This may enable a recognition of the fault indicator by the sensor signal receiver.

Alternatively or additionally, each pulse of the one or more pulses may be followed by a (short) protocol frame. For example, the (short) protocol frame may comprise fewer than 33 bits (or fewer than 17 bits, fewer than 13 bits, fewer than 9 bits, fewer than 5 bits) or corresponding signal edges/values. The control module 14 may be configured to transmit the fault indicator user a flag or message encoded within the protocol frame. For example, the protocol frame may comprise a bit position or bit field comprising a bit/flag/signal value or bit/signal edge sequence indicating the fault indicator.

The control module 14 is further configured to receive a control signal from the sensor signal receiver 200 in response to the fault indicator. For example, the control signal may be based on a pulse width modulation, or based on a binary transmission coding, e.g. a Manchester coding.

The control signal comprises at least one fault handling instruction. For example, the at least one fault handling instruction may comprise at least one element of the group of an instruction to transmit diagnostic information, an instruction to execute a self-test of the sensor module 100, an instruction to obtain diagnostic information from a memory, an instruction to alter one or more parameters of the sensor module, an instruction to alter one or more parameters of the sensor controller and an instruction to restart the sensor module and/or the sensor controller.

For example, the control module 14 may be configured to accept the at least one fault handling instruction (only) after starting the transmitting of the fault indicator. For example, the control module 14 may be configured to enter a diagnostic mode (a safe mode) based on the transmitting of the fault indicator. The control module 14 may be configured to execute the at least one fault handling instruction (only) while in the diagnostic mode. This may improve a security of operation of the sensor controller (e.g. by restricting an execution of the at least one fault handling instruction to safe/diagnostic modes of the sensor controller).

The control module 14 is further configured to execute the at least one fault handling instruction. For example, the control module 14 may be configured to execute one or more program functions to execute the at least one fault handling instruction.

The sensor controller may enable an adjustment of the sensor module in case a failure of at least a part of the sensor module occurs. For example, the sensor signal receiver may adjust the sensor module in case of failure and/or the sensor signal receiver may collect diagnostic information related to the failure.

For example, the control module 14 may be configured to determine diagnostic information based on the at least one fault handling instruction. The diagnostic information may for example be used to diagnose the failure, e.g. to enable the sensor signal receiver to provide additional fault handling instructions to correct the failure. The control module 14 may be configured to transmit the diagnostic information to the sensor signal receiver 200. For example, the diagnostic information may be based on a self-test of the sensor module 100 or of the sensor controller 10. Alternatively or additionally, the diagnostic information may be based on contents of a memory of the sensor controller or of the sensor module, e.g. of status registers or of an error log on a programmable memory, e.g. an Electronically Erasable Programmable Read Only Memory (EEPROM).

For example, the control module 14 may be configured to execute a self-test of the sensor controller 10 and/or the sensor module 100 to determine the diagnostic information based on the at least one fault handling instruction. The self-test may enable determining a cause for the failure. Alternatively or additionally, the control module 14 may be configured to obtain at least parts of the diagnostic information from a memory (e.g. a register or a programmable memory) of the sensor module 100. Reading out (status) memory for the diagnostic information may enable a transmission of previously determined diagnostic information.

For example, the control module 14 may be configured to alter one or more parameters of the sensor controller 10 or of the sensor module 100 based on the at least one fault handling instruction, e.g. one or more parameters of the group of a sensor threshold, a sensor detection parameter, a switching threshold, a hysteresis of the sensor module, an operating mode of the sensor module or of the sensor controller, or a sensor signal resolution. This may enable the sensor controller to correct the failure. For example, the control module 14 may be configured to set or change one or more values stored in one or more registers to alter the one or more parameters.

For example, the control module 14 may be configured to restart or reinitialize at least parts of the sensor module 100 and/or the sensor controller 10 based on the at least one fault handling instruction, e.g. one or more sensors or emitters or a transmission component. For example, some failures may be solved by restarting parts of the sensor module. For example, the control module 14 may be configured to transmit a reset signal or reset indicator to restart or reinitialize at least parts of the sensor module 100 and/or the sensor controller 10, or to temporarily switch off a power supply of at least parts of the sensor module 100 and/or the sensor controller 10.

In at least some embodiments, the at least one interface 12 may be configured to communicate with the sensor signal receiver 200 using a two wire connection. For example, the two wire connection may comprise (as shown in FIG. 3) a supply voltage (wire) and a ground (wire). The at least one interface 12 may be configured to transmit the sensor signal, the fault indicator and/or diagnostic information based on a current modulation (e.g. of the supply voltage). For example, the control module 14 may be configured to adapt a current draw over one of the two wires (e.g. of the supply voltage) to transmit the sensor signal, the fault indicator and/or diagnostic information. Alternatively, the at least one interface 12 may be configured to transmit the sensor signal, the fault indicator and/or diagnostic information based on a voltage modulation. For example, the control module 24 may be configured to transmit the sensor signal, the fault indicator and/or the diagnostic information based on a modulated open drain voltage or on a modulated current consumption of the sensor module 100. For example, the control signal may be based on a voltage modulation of a supply voltage or of an open drain voltage or based on a current modulation.

Figure 4:
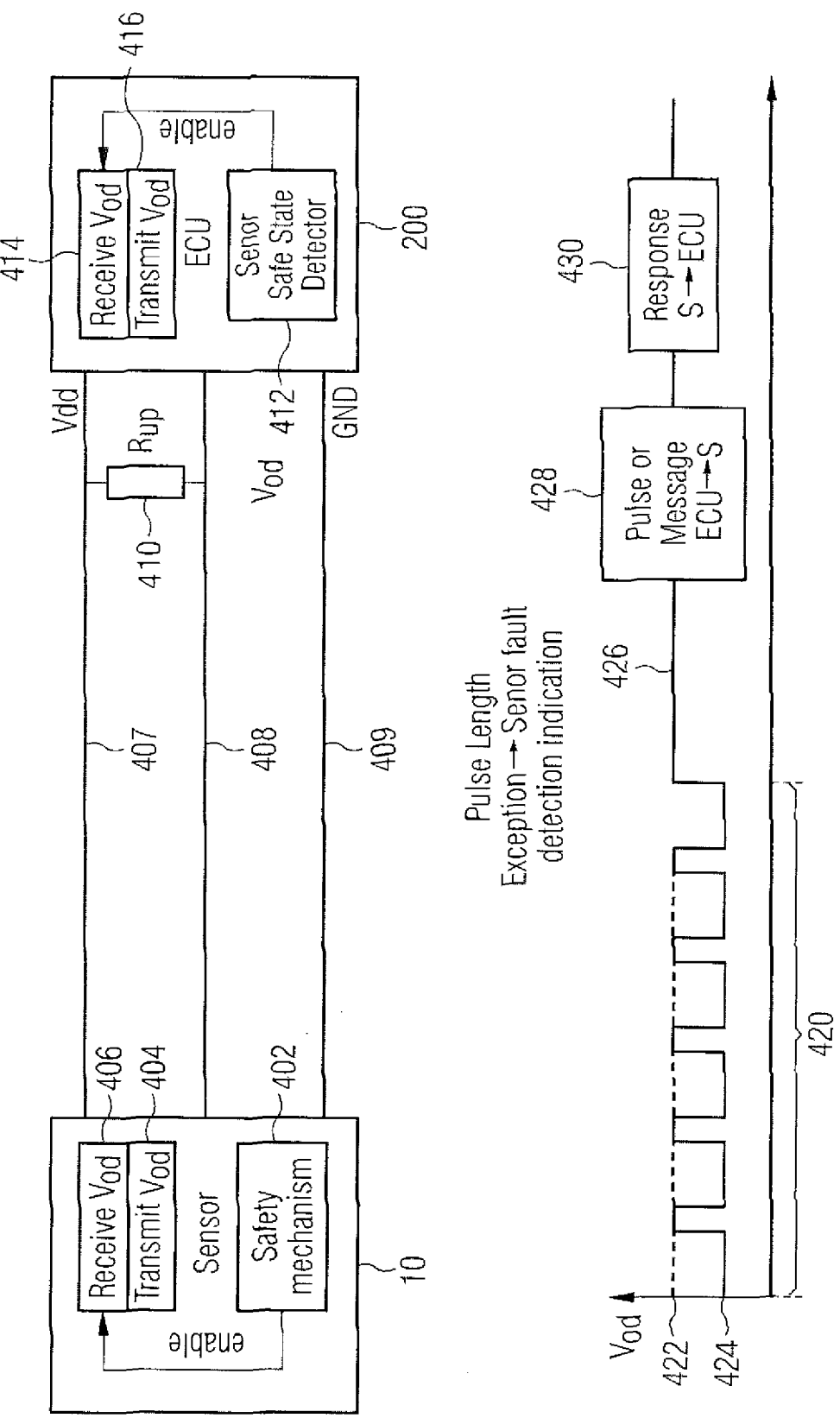
FIG. 4 shows a system comprising a sensor controller and a sensor signal receiver connected via a three wire connection.

In various embodiments, the at least one interface may be configured to communicate with the sensor signal receiver 200 using a three wire connection (e.g. as shown in FIG. 4). The three wire connection may comprise a supply voltage (wire), an open drain voltage (wire) and a ground (wire).

The at least one interface 12 (and/or at least one interface 22 of FIG. 2) may correspond to one or more inputs and/or outputs for receiving and/or transmitting information, which may be in digital (bit) values according to a specified code, within a module, between modules or between modules of different entities. In embodiments the control module 14 (and/or a control module 24 of FIG. 2) may be implemented using one or more processing units, one or more processing devices, any means for processing, such as a processor, a computer or a programmable hardware component being operable with accordingly adapted software. In other words, the described function of the control module 14; 24 may as well be implemented in software, which is then executed on one or more programmable hardware components. Such hardware components may comprise a general purpose processor, a Digital Signal Processor (DSP), a micro-controller, etc.

Figure 1A:
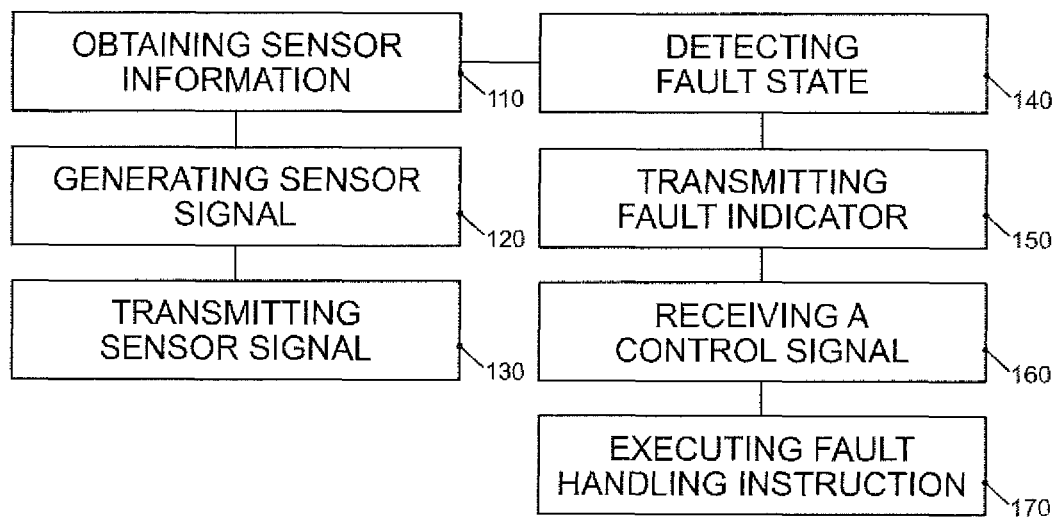
FIG. 1A illustrates a flow chart of a method for a sensor controller for a sensor module.

FIG. 1A illustrates a flow chart of a method for a sensor controller 10 for a sensor module 100. The method may comprise one or more features of the control module 14 of FIG. 1. The method comprises obtaining 110 sensor information from the sensor module 100. The method further comprises generating 120 a sensor signal based on the sensor information. The method further comprises transmitting 130 the sensor signal (e.g. to the sensor signal receiver 200). The method further comprises detecting 140 a fault state of the sensor module. The method further comprises transmitting 150 a fault indicator (e.g. to the sensor signal receiver 200) if the fault state indicates a failure of at least a part of the sensor module 100. The method further comprises receiving 160 a control signal from the sensor signal receiver 200 in response to the fault indicator. The control signal comprises at least one fault handling instruction. The method further comprises executing 170 the at least one fault handling instruction.

More details and aspects of the method for the sensor controller are mentioned in connection with the proposed concept or one or more examples described above (e.g. FIG. 1). The method for the sensor controller may comprise one or more additional optional features corresponding to one or more aspects of the proposed concept or one or more examples described above or below.

Figure 2:
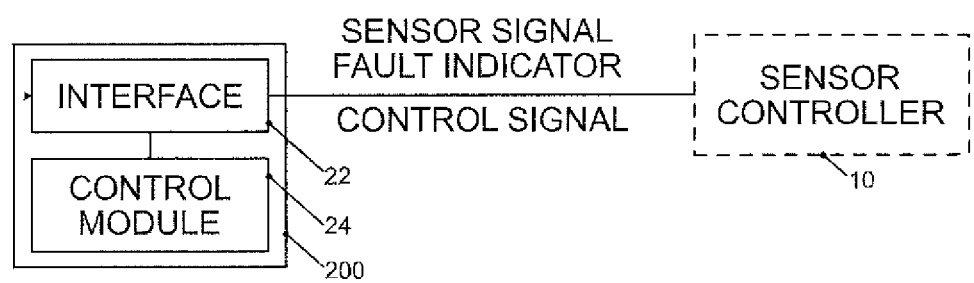
FIG. 2 illustrates a block diagram of a sensor signal receiver.

FIG. 2 illustrates a block diagram of a sensor signal receiver 200. The sensor signal receiver 200 comprises at least one interface 22 to communicate with a sensor controller 10.

The sensor signal receiver 200 further comprises a control module 24 to control the at least one interface 22. The control module 24 is further configured to receiver a sensor signal from the sensor controller 10 via the at least one interface.

The sensor signal receiver 200 is configured to receive a fault indicator from the sensor controller 10 via the at least one interface 22, e.g. instead or in place of the sensor signal. For example, the fault indicator may indicate a failure of at least parts of a sensor module 100 comprising the sensor controller 10. For example, the fault indicator may correspond to a voltage level, a current level, a length of a signal pulse or to a succession of signal values not used for the sensor signal. For example, the control module 24 may be configured to detect the fault indicator based on the voltage level, the current level, the length of a signal pulse or the succession of signal values not used for the sensor signal.

The control module 24 is configured to provide a control signal to the sensor controller 10 via the at least one interface 22 in response to the fault indicator. The control signal comprises at least one fault handling instruction.

Receiving the fault indicator may alert the sensor signal receiver of a failure of at least a part of a sensor module 100 comprising the sensor controller 10. Providing the control module may enable a diagnosis or correction of the failure.

For example, the at least one fault handling instruction may comprise at least one element of the group of an instruction to transmit diagnostic information, an instruction to execute a self-test of a sensor module 100 comprising the sensor controller 10, an instruction to obtain diagnostic information from a memory of the sensor controller 10 or of the sensor module 100, an instruction to alter one or more parameters of the sensor module 100, an instruction to alter one or more parameters of the sensor controller 10 and an instruction to restart the sensor module and/or the sensor controller.

The control module 24 may be configured to generate a plurality of successive signal edges to generate the control signal, for example. For example, a temporal distance or interval between successive signal edges may indicate an information content of the control signal. For example, the control module 24 may be configured to modulate a current or to modulate a voltage (e.g. an open drain voltage or a supply voltage) to generate or transmit the control signal.

For example, the control module 24 may be configured to determine the at least one fault instruction based on the fault indicator, e.g. based on a failure of at least a part of the sensor controller or of the sensor module indicated by the fault indicator. For example, the control module 24 may be configured to transmit the at least one fault handling instruction irrespective of an information content of the fault indicator. Alternatively, the control module 24 may choose one or more of a plurality of fault handling instructions for the control signal based on the fault indicator (e.g. based on a fault state of the sensor module 100 indicated by the fault indicator).

In at least some embodiments, the at least one interface 22 may be configured to communicate with the sensor controller 20 using a two wire connection. For example, the two wire connection may comprise a supply voltage (wire) and a ground (wire) (as shown in FIG. 3). The at least one interface 22 may be configured to receive the sensor signal, the fault indicator and/or diagnostic information based on a current modulation (e.g. of the supply voltage) or based on voltage modulation. For example, the control module 24 may be configured to transmit the control signal based on a modulated open drain voltage or on a modulated supply voltage. For example, the control signal may be based on a voltage modulation of a supply voltage or of an open drain voltage or based on a current modulation. For example, the control module 24 may be configured to transmit the control signal by modulating the control signal onto a supply voltage and/or to receive the fault indicator based on a modulated open drain voltage or based on a modulated current consumption of the sensor.

In some embodiments, the control module 24 may be further configured to receive diagnostics information from the sensor controller 10 via the at least one interface 22 in response to the control signal. This may enable a diagnosis of the failure of the sensor module and/or of the sensor controller. For example, the control module 24 may be further configured to forward the diagnostics information to a vehicular control entity of a vehicle comprising the sensor signal receiver. Alternatively or additionally, the control module 24 may be configured to adapt the control signal and/or the one or more fault handling instructions based on the diagnostics information, e.g. to retrieve further diagnostic information or to adapt one or more parameters of the sensor controller or of the sensor module.

More details and aspects of the sensor signal receiver are mentioned in connection with the proposed concept or one or more examples described above (e.g. FIG. 1 to FIG. 1A). The sensor signal receiver may comprise one or more additional optional features corresponding to one or more aspects of the proposed concept or one or more examples described above or below.

Figure 2A:
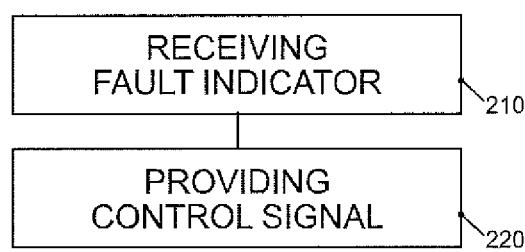
FIG. 2A illustrates a flow chart of a method for a sensor signal receiver.

FIG. 2A illustrates a flow chart of a method for a sensor signal receiver 200. The method may comprise one or more features of the control module 24 of FIG. 2. The method comprises receiving 210 a fault indicator from a sensor controller 10. The method further comprises providing 220 a control signal to the sensor controller 10 in response to the fault indicator. The control signal comprises at least one fault handling instruction.

More details and aspects of the method for the sensor signal receiver are mentioned in connection with the proposed concept or one or more examples described above (e.g. FIGS. 1 to 2). The method for the sensor signal receiver may comprise one or more additional optional features corresponding to one or more aspects of the proposed concept or one or more examples described above or below.

At least some embodiments provide wheel speed sensors (e.g. sensor modules 100) opening a diagnostic channel in case of fault detection. At least some embodiments may bring a sensor that already detected and signaled a fault (a fault state) into a state that enables the ECU (Electronic Control Unit, e.g. the sensor signal receiver 200) to read internal fault detection information or initiate additional tests.

Incremental speed sensors may use a 2 wire interface with a current modulation representing threshold crossings of a magnetic field by edges or pulses switching between 2 or 3 states of current consumption. Alternatively, 3 wire open drain interfaces may be used to transmit the same type of information. Some sensors may have the ability to deliver limited additional information of a few bit subsequent to the edge or pulse.

Furthermore, some sensors (e.g. the sensor controller 10) may also perform safety measures and go into a safe state by sending an error message (e.g. a fault indicator). In normal operation, the sensor comprising a safety mechanism may be compatible to other sensors for the same application (e.g. wheel speed, transmission, camshaft, crank shaft). In case that an internal safety mechanism is detecting a fault it goes into a safe state e.g. by switching to a fault signal level of half of the low level of regular communication or by sending at least one signal that can be recognized as an illegal speed pulse (e.g. increase pulse length). Some sensors might not allow (any) access to internal data or execution of commands on demand of the ECU.

Once the safety measure is activated, the sensor (e.g. a sensor controller) may enable a receiver that may be deactivated during normal operation and may be configured to listen on messages from the ECU. On the other side the ECU may comprise a transmitter that is inactive during normal operation as well and which might be activated once the ECU detects that the sensor switched to the safe state.

The ECU message can be sent by supply voltage modulation for both types of sensor interfaces (2 wire interface (e.g. wheel speed or transmission) or 3 wire open drain (e.g. cam shaft or crank shaft)).

If the ECU at least sends a detectable pulse or (in some cases preferably) a decodable command message, the sensor may be configured to respond with execution of an exception routine and deliver information back to the ECU.

Exception routines may be, for example:

Dump all or a selection of internal registers;

Write data into internal registers e.g. to modify a switching threshold or a hysteresis;

Execute a self-test and return the result;

Execute an initialization routine that allows to return to normal operation faster than a restart be turning the sensor supply off controlled by the ECU and reinitializing by a new power up.

The ECU message may also be transmitted over the open drain connection of a 3 wire interface for the case that the safe state of the interface turns the open drain switch off. In this case the ECU may also use an open drain transistor to pull down the communication line for the case that it transmits on the other hand the communication in the case of fault diagnosis may require higher data rates and thus both sides may also have push pull drivers for this communication mode (in case of the ECU a normal microcontroller tristate output may be used as transmitter). This may enable that the diagnosis communication can be recognized due to its high state closer to Vdd than the normal open drain speed pulses.

A 3 wire system may also make use of the supply lines and combine both communication channels e.g. to establish a full duplex communication e.g. with the sensor transmitting over its usual output while the ECU modulates the supply.

FIG. 3 shows an exemplary system comprising a sensor controller 10 and a sensor signal receiver 200 connected by a two wire connection. The two wire connection comprises a supply voltage (Vdd) wire 308 and a ground (GND) wire 309. The sensor controller 10 may comprise a safety mechanism 302 to enable transmitting 304 a fault indicator via a current modulation to the sensor signal receiver 200 using the supply voltage Vdd 308 and to enable receiving 306 a control signal via a voltage modulation of the supply voltage 308 from the sensor signal receiver 200. The sensor signal receiver 200 may comprise a sensor safe state detector 312 (e.g. the control module 24 of FIG. 2) to enable receiving 314 the fault indicator (based on the current modulation) and to enable transmitting 316 the control signal (based on the voltage modulation). For example, the sensor controller may be configured to transmit a sensor signal 320 to the sensor signal receiver based on the current modulation, e.g. based on a first current draw 322 and a second current draw 324 of a supply current IVdd. The sensor controller may further be configured to transmit the fault indicator based on a third current draw 326 of the supply current. In response to the fault indicator, the sensor signal receiver may be configured to transmit a control signal 328 comprising a pulse or a message (based on a voltage modulation of the supply voltage). In response to the control signal, the sensor controller may be configured to transmit diagnostic information 330 to the sensor signal controller (based on a current modulation of the supply current).

FIG. 4 shows an exemplary system comprising a sensor controller 10 and a sensor signal receiver 200 connected by a three wire connection. The three wire connection comprises a supply voltage (Vdd) wire 407, an open drain voltage (Vod) wire 408, a ground (GND) wire 409 and a pull-up resistor 410. The sensor controller 10 may provide a safety mechanism 402 (e.g. the control module 14 of FIG. 1) to enable transmitting 404 a fault indicator via a voltage modulation of the open drain voltage Vod 408 to the sensor signal receiver 200 and to enable receiving 406 a control signal via a voltage modulation of the open drain voltage 408 from the sensor signal receiver 200. The sensor signal receiver 200 may comprise a sensor safe state detector 412 (e.g. the control module 24 of FIG. 2) to enable receiving 414 the fault indicator (based on the voltage modulation of the open drain voltage) and to enable transmitting 416 the control signal (based on the voltage modulation of the open drain voltage). For example, the sensor controller may be configured to transmit a sensor signal 420 to the sensor signal receiver based on the current modulation, e.g. based on a first voltage 422 and a second voltage 424 of an open drain voltage Vod. The sensor controller may further be configured to transmit the fault indicator based on remaining 426 at the first voltage 422. In response to the fault indicator, the sensor signal receiver may be configured to transmit a control signal 428 comprising a pulse or a message (based on a voltage modulation of the open drain voltage). In response to the control signal, the sensor controller may be configured to transmit diagnostic information 430 to the sensor signal controller (based on a voltage modulation of the open drain voltage).

Various modulation schemes and protocol mechanism known from communication systems may be used during the diagnosis state. The communication protocol for the case that the sensor entered the diagnosis state can be proprietary like the SICI (Serial Inspection and Configuration Interface) interface that may be already used for test and programming purposes in many sensors. It may also adopt a standard like PSI5 (Peripheral Sensor Interface 5) or DSI3 (Distributed Systems Interface 3) for the 2 wire interface or SPC (Short Pulse width modulation Code) for the 3 wire communication. Embodiments may be used in sensor integrated circuits as well as customer systems, for example.

In some embodiments, the ECU may be configured to activate a diagnostic mode during normal operation as well, for example if it can be avoided that another communication protocol can be interpreted as speed pulses.

At least some embodiments may be based on opening a diagnostic communication channel for the case that a sensor goes into a safe state, e.g. for a narrow time window. At least some embodiments may extend diagnostic capability of speed sensors for high ASIL (Automotive Safety Integrity Level) levels.

More details and aspects of the concept are mentioned in connection with the proposed concept or one or more examples described above (e.g. FIGS. 1 to 2A). The concept may comprise one or more additional optional features corresponding to one or more aspects of the proposed concept or one or more examples described above or below.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A sensor controller for a sensor module, comprising
at least one interface to obtain sensor information from the sensor module and to communicate with a sensor signal receiver; and
a control module to:
control the at least one interface,
obtain the sensor information from the sensor module,
generate a sensor signal based on the sensor information,
transmit the sensor signal,
detect a fault state of the sensor module,
transmit, based on the fault state indicating a failure of the sensor module, a fault indicator by using at least one of:
a current level above or below two or more sensor signal transmission current levels,
a pulse having a pulse width that is a threshold length longer than a pre-defined maximal pulse width, or
a flag or message encoded within a protocol frame,
receive a control signal from the sensor signal receiver based on the fault indicator,
wherein the control signal comprises at least one fault handling instruction, and
execute the at least one fault handling instruction.

2. The sensor controller according to claim 1, wherein the control module is configured to:
determine diagnostic information based on the at least one fault handling instruction, and
transmit the diagnostic information to the sensor signal receiver.

3. The sensor controller according to claim 2, wherein the control module is configured to execute a self-test of at least one of the sensor controller or the sensor module to determine the diagnostic information based on the at least one fault handling instruction.

4. The sensor controller according to claim 2, wherein the control module is configured to obtain at least a part of the diagnostic information from a memory of the sensor module.

5. The sensor controller according to claim 1, wherein the control module is configured to alter one or more parameters of the sensor controller or of the sensor module based on the at least one fault handling instruction.

6. The sensor controller according to claim 1, wherein the control module is configured to restart at least a part of one or more of the sensor module or the sensor controller based on the at least one fault handling instruction.

7. The sensor controller according to claim 1, wherein the control module is configured to accept the at least one fault handling instruction after starting transmission of the fault indicator.

8. The sensor controller according to claim 1, wherein the control module is configured to:
enter a diagnostic mode based on transmitting the fault indicator, and
execute the at least one fault handling instruction while in the diagnostic mode.

9. The sensor controller according to claim 1, wherein the control module, when transmitting the sensor signal, is configured to:
transmit the sensor signal based on at least one of:
the two or more sensor signal transmission current levels,
a signal pulse comprising the pre-defined maximal pulse width, or
the signal pulse being followed by the protocol frame.

10. The sensor controller according to claim 1, wherein the at least one interface is configured to:
communicate with the sensor signal receiver using a two wire connection, and
transmit at least one of the sensor signal or diagnostic information based on a current modulation.

11. The sensor controller according to claim 1, wherein the control signal is based on a voltage modulation of a supply voltage or of an open drain voltage.

12. The sensor controller according to claim 1, wherein the at least one interface is configured to wirelessly communicate with the sensor signal receiver.

13. The sensor controller according to claim 12, wherein the control module is configured to activate a wireless receiver portion of the at least one interface if the fault state indicates the failure of the sensor module.

14. A sensor signal receiver comprising:
at least one interface to communicate with a sensor controller; and
a control module to:
control the at least one interface,
receive a fault indicator from the sensor controller via the at least one interface,
the fault indicator indicating a failure of a sensor module associated with the sensor controller, and the fault indicator being at least one of:
  a current level above or below two or more sensor signal transmission current levels,
  a pulse having a pulse width that is a threshold length longer than a pre-defined maximal pulse width, or
  a flag or message encoded within a protocol frame, and
provide a control signal to the sensor controller via the at least one interface based on the fault indicator, wherein the control signal comprises at least one fault handling instruction.

15. The sensor signal receiver according to claim 14, wherein the control module is further configured to receive diagnostics information from the sensor controller via the at least one interface based on the control signal.

16. The sensor signal receiver according to claim 14, wherein the at least one interface is configured to:
  transmit the control signal by modulating the control signal onto a supply voltage, and
  receive the fault indicator based on a modulated open drain voltage or a modulated current consumption of a sensor.

17. An incremental magnetic speed sensor module for automotive use comprising a sensor controller, the sensor controller comprising:
  a control module to:
    generate a sensor signal based on sensor information obtained from the incremental magnetic speed sensor module,
    transmit the sensor signal,
    detect a fault state of the incremental magnetic speed sensor module,
    transmit, based the fault state indicating a failure of the incremental magnetic speed sensor module, a fault indicator by using at least one of:
      a current level above or below two or more sensor signal transmission current levels,
      a pulse having a pulse width that is a threshold length longer than a pre-defined maximal pulse width, or
      a flag or message encoded within a protocol frame,
    receive a control signal from a sensor signal receiver based on the fault indicator,
      wherein the control signal comprises at least one fault handling instruction, and
    execute the at least one fault handling instruction.

18. A method, comprising:
  obtaining, by a sensor controller, sensor information from a sensor module;
  generating, by the sensor controller, a sensor signal based on the sensor information;
  transmitting, by the sensor controller, the sensor signal to a sensor signal receiver;
  detecting, by the sensor controller, a fault state of the sensor module;
  transmitting, by the sensor controller and based on the fault state indicating a failure of the sensor module, a fault indicator by using at least one of:
    a current level above or below two or more sensor signal transmission current levels,
    a pulse having a pulse width that is a threshold length longer than a pre-defined maximal pulse width, or
    a flag or message encoded within a protocol frame;
  receiving, by the sensor controller, a control signal from the sensor signal receiver based on the fault indicator,
    wherein the control signal comprises at least one fault handling instruction; and
  executing, by the sensor controller, the at least one fault handling instruction.

19. A method, comprising:
  receiving, by a sensor signal receiver, a fault indicator from a sensor controller,
    the fault indicator indicating a failure of a sensor module associated with the sensor controller, and
    the fault indicator being at least one of:
      a current level above or below two or more sensor signal transmission current levels,
      a pulse having a pulse width that is a threshold length longer than a pre-defined maximal pulse width, or
      a flag or message encoded within a protocol frame; and
  providing, by the sensor signal receiver, a control signal to the sensor controller based on the fault indicator,
    wherein the control signal comprises at least one fault handling instruction.

20. A non-transitory computer-readable medium storing instructions, the instructions comprising:
  one or more instructions that, when executed by one or more processors of a sensor controller for a sensor module, cause the one or more processors to:
    obtain sensor information from the sensor module;
    generate a sensor signal based on the sensor information;
    transmit the sensor signal to a sensor signal receiver;
    detect a fault state of the sensor module;
    transmit, based on the fault state indicating a failure of the sensor module, a fault indicator by using at least one of:
      a current level above or below two or more sensor signal transmission current levels,
      a pulse having a pulse width that is a threshold length longer than a pre-defined maximal pulse width, or
      a flag or message encoded within a protocol frame;
    receive a control signal from the sensor signal receiver based on the fault indicator,
      wherein the control signal comprises at least one fault handling instruction; and
    execute the at least one fault handling instruction.

* * * * *